United States Patent
Hutchins

(10) Patent No.: US 11,289,636 B2
(45) Date of Patent: *Mar. 29, 2022

(54) ENERGY RECOVERY UNIT FOR VEHICLE USE

(71) Applicant: JAGUAR LAND ROVER LIMITED, Coventry (GB)

(72) Inventor: William Hutchins, Coventry (GB)

(73) Assignee: Jaguar Land Rover Limited, Coventry (GB)

( * ) Notice: Subject to any disclaimer, the term of this patent is extended or adjusted under 35 U.S.C. 154(b) by 0 days.

This patent is subject to a terminal disclaimer.

(21) Appl. No.: 16/091,449

(22) PCT Filed: Apr. 6, 2017

(86) PCT No.: PCT/EP2017/058181
§ 371 (c)(1),
(2) Date: Oct. 4, 2018

(87) PCT Pub. No.: WO2017/174694
PCT Pub. Date: Oct. 12, 2017

(65) Prior Publication Data
US 2019/0088846 A1     Mar. 21, 2019

(30) Foreign Application Priority Data

Apr. 6, 2016 (GB) ..................................... 1605852
Apr. 6, 2016 (GB) ..................................... 1605855

(51) Int. Cl.
*H01L 35/30* (2006.01)
*F01N 5/02* (2006.01)
*F01N 13/08* (2010.01)

(52) U.S. Cl.
CPC .............. *H01L 35/30* (2013.01); *F01N 5/025* (2013.01); *F01N 13/08* (2013.01); *Y02T 10/12* (2013.01)

(58) Field of Classification Search
CPC ......... F01N 13/08; F01N 5/025; H01L 35/30; Y02T 10/16
See application file for complete search history.

(56) References Cited

U.S. PATENT DOCUMENTS 9,677,511 B2 * 6/2017 Groezinger ............... F28F 1/32
2011/0088672 A1   4/2011 Prior et al.
(Continued)

FOREIGN PATENT DOCUMENTS

EP        2208874 A     7/2010
GN     102066708 A     5/2011
(Continued)

OTHER PUBLICATIONS

Search and Examination Report, GB1605855.4, dated Sep. 23, 2016, 5 pages.
(Continued)

*Primary Examiner* — Phutthiwat Wongwian
*Assistant Examiner* — Diem T Tran
(74) *Attorney, Agent, or Firm* — McCoy Russell LLP

(57) ABSTRACT

An energy recovery unit (8) for use in a vehicle exhaust system (6) comprises an inlet (24) for receiving exhaust gas from the exhaust system (6); an outlet (26) for returning exhaust gas to the exhaust system (6); a thermoelectric generator (20) disposed between the inlet (24) and the outlet (26); and a valve arrangement operable to direct exhaust gas entering the inlet (24) across the thermoelectric generator (20) to enable the thermoelectric generator (20) to generate electrical energy from thermal energy contained in the exhaust gas, wherein the valve arrangement is operable to vary the direction of exhaust gas flow across the thermoelectric generator (20).

20 Claims, 10 Drawing Sheets

(56) References Cited

U.S. PATENT DOCUMENTS

| | | | |
|---|---|---|---|
| 2011/0120106 A1* | 5/2011 | Bruck | F01N 5/025 60/320 |
| 2011/0126530 A1 | 6/2011 | Callahan et al. | |
| 2011/0308560 A1* | 12/2011 | Arbuckle | H01L 35/30 136/205 |
| 2013/0192272 A1* | 8/2013 | Ranalli | B60L 50/30 62/3.3 |
| 2014/0182648 A1 | 7/2014 | Seon et al. | |

FOREIGN PATENT DOCUMENTS

| | | |
|---|---|---|
| GN | 103904948 A | 7/2014 |
| WO | 2011107282 A | 3/2011 |

OTHER PUBLICATIONS

International Search Report and Written Opinion, PCT/EP2017/058181, dated Jun. 12, 2017, 11 pages.
State Intellectual Property Office of the People's Republic of China, Office Action and Search Report Issued in Application No. 201780020251.8, dated Nov. 3, 2021, 15 pages. (Submitted with Partial Translation).

* cited by examiner

ENERGY RECOVERY UNIT FOR VEHICLE USE

CROSS-REFERENCE TO RELATED APPLICATIONS

This application is a 371 of International Application No. PCT/EP2017/058181, filed Apr. 6, 2017, which claims priority to GB Patent Application 1605855.4, filed Apr. 6, 2016, and GB Patent Application No. 1605852.1, filed Apr. 6, 2016 the contents of both of which are incorporated by reference herein in their entirety.

TECHNICAL FIELD

The present disclosure relates to an energy recovery unit for use in a vehicle exhaust system. Aspects of the invention relate to a vehicle exhaust system and to a vehicle incorporating such an energy recovery unit.

BACKGROUND

Thermoelectric generators (TEGs) convert heat energy to electrical energy using the Seebeck effect. A typical TEG comprises a plurality of metal plates having high thermal conductivities with thermoelectric materials between them, sandwiched between covers made of a dielectric, substrate material.

It is well-known that vehicle engines are only about 30% efficient, and in normal use generate significant waste heat. Over recent years, TEG devices have been incorporated into vehicle exhaust systems in order to harness waste heat from the exhaust gas. This decreases the load of an electric generator such as an alternator on the engine, in turn improving fuel consumption.

A problem associated with using TEGs in this way is that they only operate efficiently over a relatively narrow temperature range—at low temperatures, energy generation is very inefficient; and at high temperatures, the thermoelectric materials are in danger of damage from overheating. In certain scenarios, it has been found that the leading edges of the TEGs may overheat before the majority of the TEG has reached a suitably high temperature for efficient operation to occur. As a result, the hot exhaust air must be diverted away from the thermoelectric materials using bypass valves to prevent damage to the TEG, thereby decreasing the system performance.

The present invention has been devised to mitigate or overcome at least some of the above-mentioned problems.

SUMMARY OF THE INVENTION

According to an aspect of the present invention there is provided an energy recovery unit for use in a vehicle exhaust system, the energy recovery unit comprising: an inlet for receiving exhaust gas from the exhaust system; an outlet for returning exhaust gas to the exhaust system; a thermoelectric generator disposed between the inlet and the outlet; and a valve arrangement operable to direct exhaust gas entering the inlet across the thermoelectric generator to enable the thermoelectric generator to generate electrical energy from thermal energy contained in the exhaust gas, wherein the valve arrangement is operable to vary the direction of exhaust gas flow across the thermoelectric generator.

Advantageously, the energy recovery unit described above is able to alternate the direction of exhaust gas flow across the thermoelectric generator, and thereby prevent overheating of the leading edges of the thermoelectric generator, prolonging its lifespan. In addition, the alternating flow of the exhaust gas creates a more even temperature profile across heat-exchanging surfaces of the thermoelectric generator than is achieved by a single direction flow. This means that the hot exhaust gas is diverted away from the thermoelectric generator less frequently, and more of the exhaust gas is utilised directly by the thermoelectric generator to generate electricity. The system performance is therefore improved.

The energy recovery may comprise a gas pipe network configured to connect the inlet and the outlet. The gas pipe network may comprise a first bypass duct and a second bypass duct, the first and second bypass ducts extending between the inlet and the outlet and being disposed along respective opposing ends of the thermoelectric generator. Exhaust gas flows through the bypass ducts from the inlet to the outlet in a first flow direction.

Incorporating two bypass ducts into the energy recovery unit is particularly advantageous in providing flexibility in distribution of exhaust gas flow through the energy recovery unit, as it increases the available routes for the exhaust gas to take.

The valve arrangement may be operable to direct exhaust gas across the thermoelectric generator from the first bypass duct to the second bypass duct in a second flow direction, or from the second bypass duct to the first bypass duct in a third flow direction that is opposed to the second flow direction. This provides a mechanism for alternating the direction of exhaust gas flow across the thermoelectric generator, which is particularly useful in creating an even temperature profile across the thermoelectric generator and avoids overheating its leading edges.

The thermoelectric generator may be arranged such that the second and third flow directions are substantially perpendicular to the first flow direction. Configuring the energy recovery unit in this way allows exhaust gas flow through the bypass ducts and past the thermoelectric generator to be regulated tightly. Due to the relatively sharp change in angle between the first and the second or third flow directions, exhaust gas will continue to flow substantially in the first flow direction unless acted on by the valve arrangement to change direction. This ensures that substantially all exhaust gas bypasses the thermoelectric generator when required, further reducing the likelihood of the leading edges overheating.

The valve arrangement may comprise a first valve that is disposed at the inlet, the first valve comprising a first valve member that is positionable by a first valve actuator to control exhaust gas flow into the first and second bypass ducts. The valve arrangement may also comprise a second valve that is disposed at the outlet, the second valve comprising a second valve member that is positionable by a second valve actuator to control discharge of exhaust gas from the first and second bypass ducts. In this way, the proportion and direction of exhaust gas flow through or between the bypass ducts can easily be controlled and varied according to the energy recovery needs of the unit.

The valve member may be in the form of a flap, which is particularly beneficial in directing the exhaust gas flow when required due to its large surface area relative to its depth, meaning that when not directing the flow, the flap does not significantly obstruct the flow.

In an embodiment, the first and second valve members may be rotatable around respective pivots.

The first and second valve actuators may be operable in tandem. This allows the actuators to move the first and second valve members to substantially the same extent into complementary positions. Alternatively, or in addition, the first and second valve actuators may be independently operable, such that the first and second valve members can be moved to different positions. Independently operable valve actuators provide increased ability to regulate flow past the thermoelectric generator, thereby optimising energy generation whilst minimising the risk of heat damage to the thermoelectric generator.

The first valve member may be positionable to direct exhaust gas flow into both the first bypass duct and the second bypass duct, in which case the second valve member is positionable to allow exhaust gas to exit both the first bypass duct and the second bypass duct, thereby allowing substantially all of the exhaust gas to flow in the first flow direction. This configuration enables the thermoelectric generator to be bypassed entirely when required, for example to avoid overheating.

The first valve member may be positionable to occlude an entrance to the first bypass duct, with the second valve member being positionable to occlude an exit from the second bypass duct, so that substantially all of the exhaust gas flows from the second bypass duct to the first bypass duct across the thermoelectric generator.

The first valve member may be positionable to occlude an entrance to the second bypass duct, with the second valve member being positionable to occlude an exit from the first bypass duct, so that substantially all of the exhaust gas flows from the first bypass duct to the second bypass duct across the thermoelectric generator.

The first valve member may be positionable to partially occlude an entrance to either the first bypass duct or the second bypass duct. The second valve member may be positionable to partially occlude an exit from either the first bypass duct or the second bypass duct. The ability to provide partial closure of an entrance to or exit from a bypass duct enables the valve arrangement to control the individual exhaust gas flow rates through each duct.

The energy recovery unit may comprise a plurality of thermoelectric generators to enable a greater energy generation capacity. In such embodiments, the valve arrangement is operable to direct exhaust gas flow across each thermoelectric generator and to vary the direction of exhaust gas flow across each thermoelectric generator.

According to another embodiment, there is provided an energy recovery unit for a vehicle exhaust system, the energy recovery unit including an exhaust gas inlet and an exhaust gas outlet arranged at opposing ends and arrays of thermoelectric generators (TEGs) transversely arranged therebetween, a valve mechanism arranged to direct the exhaust gas in a first direction across the arrays of TEGs from a first side to a second side of the unit and further arranged to direct the exhaust gas in a second, opposite, direction across the TEGs from the second side of the unit to the first side of the unit, and at least one coolant duct in thermal contact with a cold surface of a respective one of the arrays of TEGs; the coolant duct comprising an inlet for influx of coolant and an outlet for outflow of coolant, the inlet being positioned substantially centrally intermediate the first and second sides of the unit; and a flow guide arranged to direct the coolant centrally away from the coolant inlet and along the first and second sides of the energy recovery unit toward the coolant outlet.

In an energy recovery unit, changing the direction of exhaust gas is beneficial to improve electrical generation efficiency and improve longevity of the TEGs. By initially directing the coolant centrally, a more consistent temperature profile can be achieved in the coolant on each side of the energy recovery unit. In this way, regardless as to whether the exhaust gas is directed in the first or the second direction, the cooling profile should be substantially the same thus further improving the efficiency and longevity of the energy recovery unit.

In one embodiment, the coolant inlet is positioned at an exhaust gas inlet end of the energy recovery unit. Such an arrangement is most efficient for cooling purposes since the coolant has its lowest temperature at the coolant inlet with the temperature increasing toward the coolant outlet. The exhaust gas on the other hand has its highest temperature at the exhaust gas inlet end. In this way, the temperature difference is maximised when including the coolant inlet at the same end of the energy recovery unit as the exhaust inlet.

The coolant inlet and the coolant outlet may be positioned at the same end of the energy recovery unit. Such an arrangement provides for improved installation and integration since the coolant reservoir can be provided at the end of the reservoir where both the coolant outlet and coolant inlet are located.

In one embodiment, the coolant outlet comprises a single port. Equally, the coolant inlet may comprise a single port (with or without a single port outlet). Employing single ports provides for improved maintainability since there are fewer leakage paths compared to a case where multiple ports are used for the inlet and/or outlet.

In one embodiment, the outlet is provided towards one side of the energy recovery unit.

The flow guide may include a plurality of coplanar walls defining adjacent flow paths between the inlet and the outlet.

In one embodiment, the flow guide comprises a U-shaped wall having a bend arranged at the coolant inlet and outlet end of the energy recovery unit, the coolant inlet positioned within the U-shaped wall and the coolant outlet positioned outside the U-shaped wall to divide the duct into a central channel directing coolant centrally away from the coolant inlet and opposing side channels directing coolant toward the coolant outlet.

According to another aspect of the present invention there is provided a vehicle exhaust system incorporating an energy recovery unit according to the above aspect.

According to a further aspect of the present invention there is provided a vehicle incorporating an energy recovery unit or a vehicle exhaust system according to the above aspects.

Within the scope of this application it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

BRIEF DESCRIPTION OF THE DRAWINGS

One or more embodiments of the invention will now be described, by way of example only, with reference to the accompanying drawings, in which.

DETAILED DESCRIPTION

Figure 1:
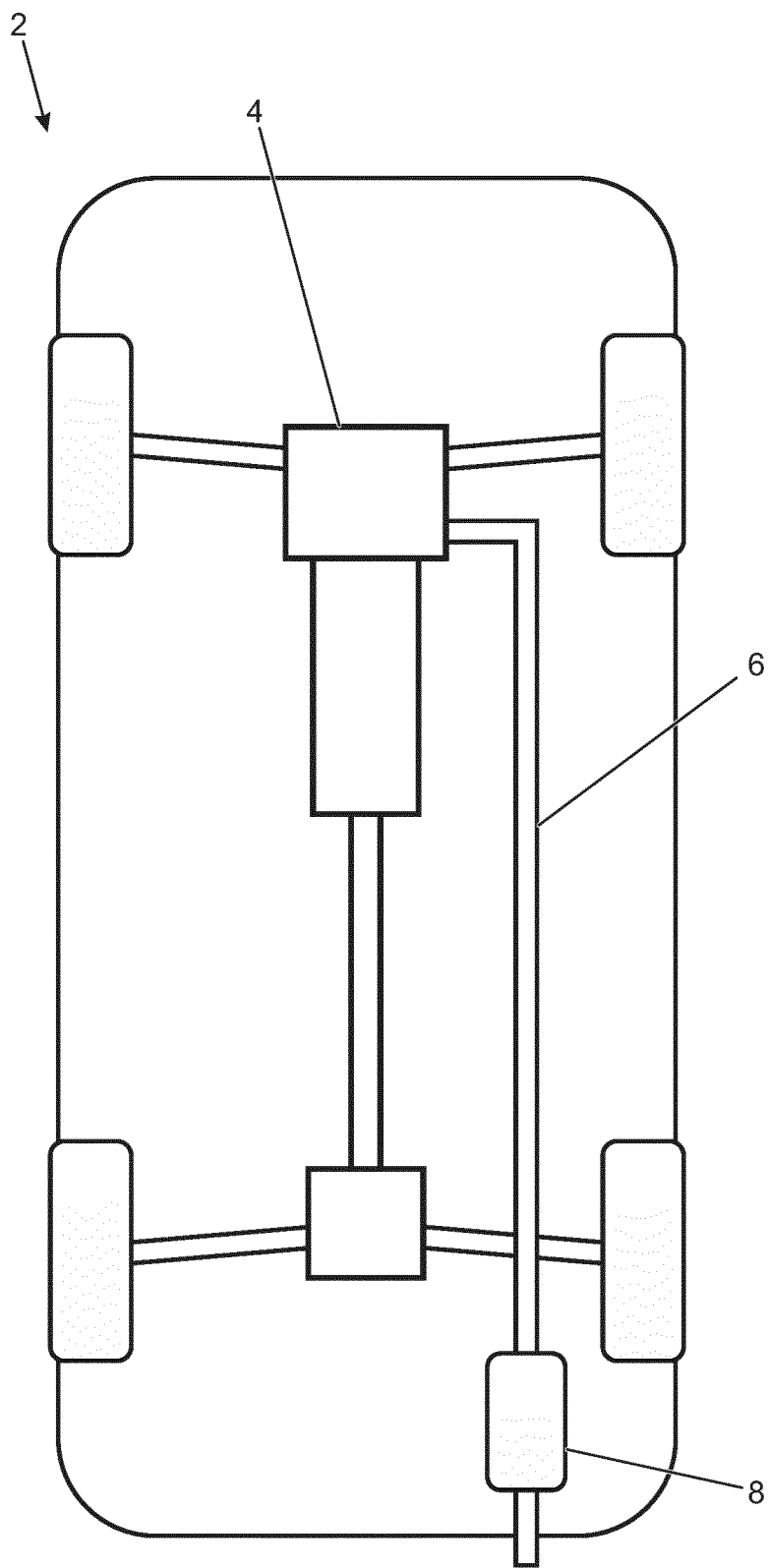
FIG. 1 is a schematic block diagram of a vehicle incorporating an energy recovery unit according to an embodiment of the present invention, which may be implemented in a vehicle exhaust system.

FIG. 1 is a schematic block diagram of a vehicle 2 which comprises an engine 4 connected to a vehicle exhaust system 6. An energy recovery unit 8 is incorporated in the vehicle exhaust system 6 in accordance with an embodiment of the present invention. The hot exhaust gas from the vehicle exhaust system 6 passes through the energy recovery unit 8 before it is expelled from the vehicle 2. The energy recovery unit 8 harnesses the heat energy from the exhaust gas passing through it, converting the heat energy into electrical energy using thermoelectric generators (not shown in FIG. 1).

Figure 2:
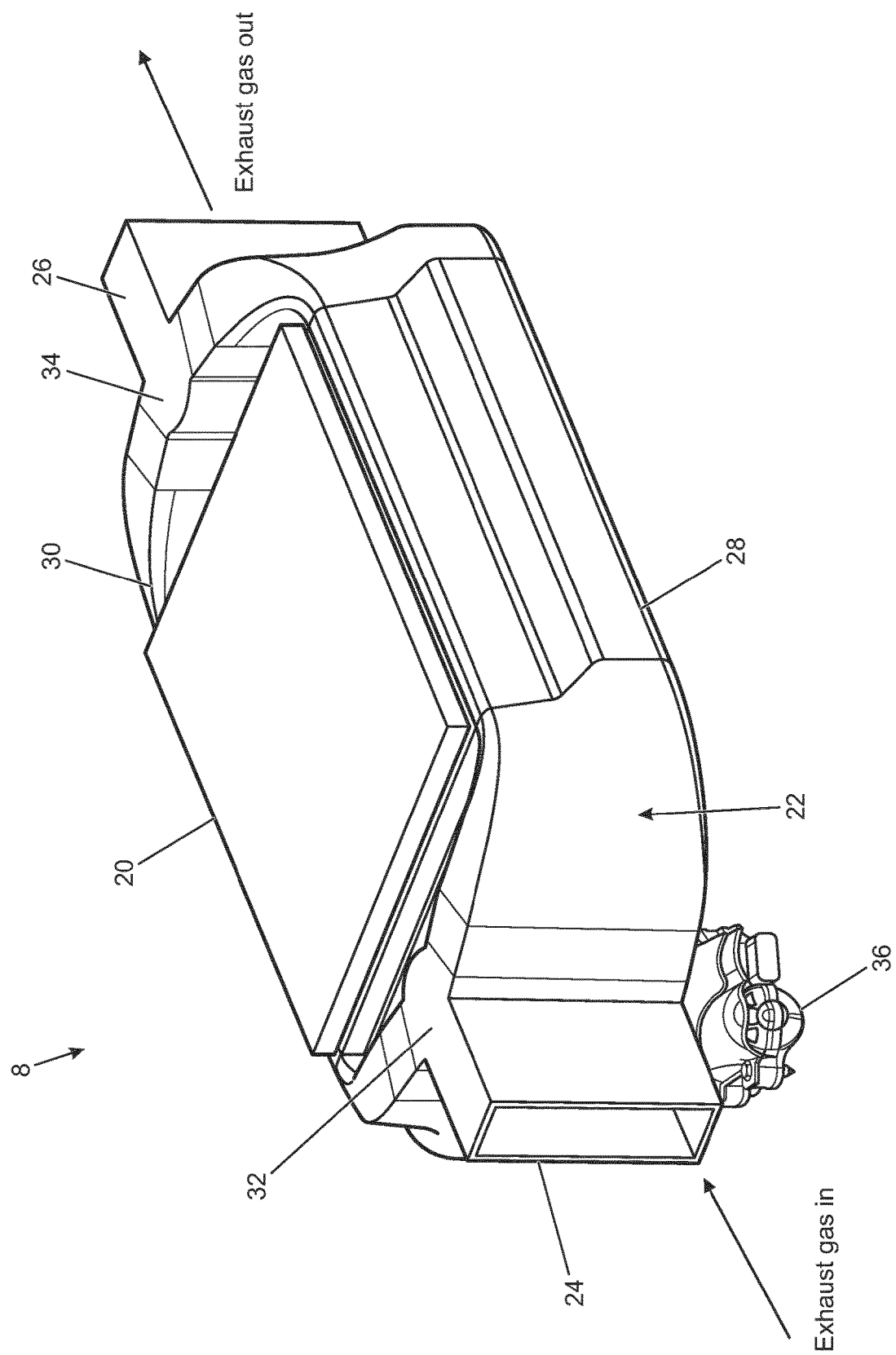
FIG. 2 is a perspective view of an energy recovery unit, which may be implemented in a vehicle exhaust system, such as that shown in FIG. 1.

FIG. 2 shows a perspective view of the energy recovery unit 8 of FIG. 1. The energy recovery unit 8 comprises a TEG module 20 surrounded by a gas pipe network 22. The gas pipe network 22 comprises an inlet pipe 24 and an outlet pipe 26 disposed at respective opposed ends of the energy recovery unit 8. Two separate bypass ducts 28, 30 flank opposed sides of the TEG module 20 to connect the inlet and outlet pipes 24, 26.

The energy recovery system 8 also comprises a valve arrangement that is operable to control exhaust gas flow through the system 8, the valve arrangement including an inlet valve (not shown in FIG. 2) positioned at the junction 32 of the bypass ducts 28, 30 directly opposite and in the vicinity of the inlet pipe 24, and an outlet valve (not shown in FIG. 2) positioned at the junction 34 of the bypass ducts 28, 30 directly opposite and in the vicinity of the outlet pipe 34. The inlet valve and the outlet valve each comprise a valve flap (not shown in FIG. 2) which can be rotated to alter the direction of the valves, thereby controlling the direction of exhaust gas flow through the energy recovery unit 8, typically by guiding exhaust flow into and out of one of the bypass ducts 28, 30. Movement of each valve flap is controlled by a respective valve actuator 36 which controls the degree and direction of deflection of each valve flap, thereby controlling the direction of exhaust gas flow through the energy recovery unit 8.

In some embodiments, the valve actuators are independently operable, such that one valve may be open to a greater extent than the other. In other embodiments, the valve actuators are operated using a single 'master' lever (not shown), enabling both valves to be controlled simultaneously, such that the deflections of the valve flaps mirror one another.

In some modes of operation, the exhaust gas passes from the inlet pipe 24 to the outlet pipe 26 exclusively through one or both of the bypass ducts 28, 30, bypassing the TEG module 20 entirely and defining a main gas flow direction. In other modes of operation, some or all of the exhaust gas flows through the TEG module 20 in a cross-flow direction that is substantially orthogonal to the main flow direction. A more detailed description of modes of operation of the energy recovery unit is provided subsequently with reference to FIGS. 5a to 5c.

Figure 3:
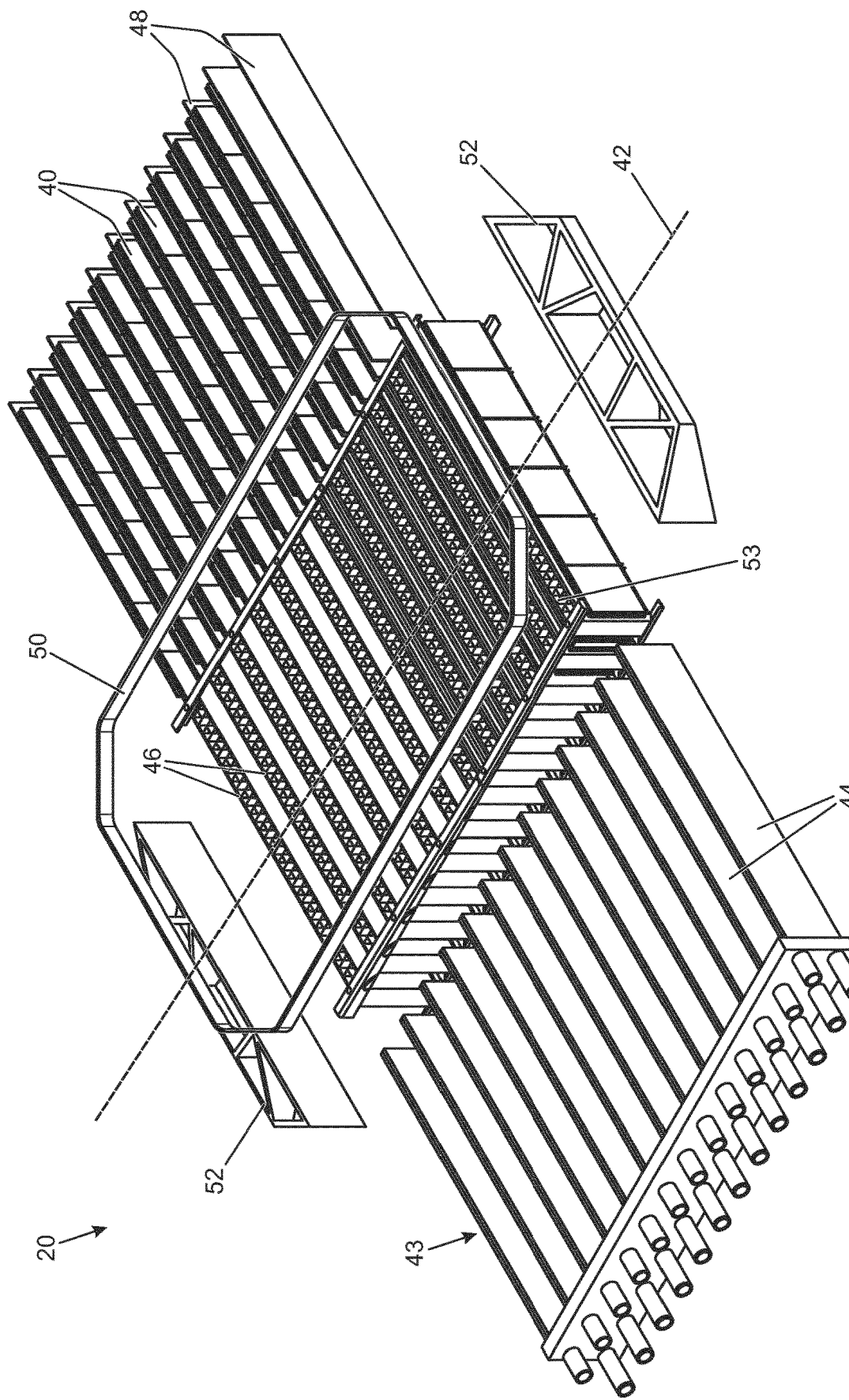
FIG. 3 is an exploded, perspective view of a TEG module according to an embodiment of the invention that may be incorporated into the energy recovery unit shown in FIG. 2.

FIG. 3 shows an exploded, perspective view of a TEG module 20 according to an embodiment of the present invention that is incorporated into the energy recovery unit 8 of FIG. 2.

The TEG module 20 comprises a plurality of TEG units 40 arranged in parallel to one another, and lying orthogonal to a plane containing a main axis 42 of the TEG module 20. The TEG units 40 are spaced from neighbouring TEG unit(s) 40 at regular intervals along the main axis 42.

Each TEG unit 40 comprises a plurality of metal plates (not shown) having high thermal conductivities with thermoelectric materials (for example, semi-conductor materials) between them, sandwiched between covers made of a dielectric, substrate material (such as a ceramic). Outer faces of the dielectric covers define heat-exchanging surfaces of the TEG unit 40—a hot-side heat-exchanging surface and a cold-side heat exchanging surface. The hot-side heat exchanging surfaces of opposed TEG units 40 are defined by a common metal structure comprising a metal plate of each TEG unit 40 joined by a bridge to create a structure of generally 'U' shaped cross-section.

The TEG units 40 are arranged in use such that the main heat-exchanging surfaces are substantially orthogonal to the main axis 42 of the TEG module 20, with the TEG units 40 disposed in alternating orientation such that the hot-side heat exchanging surface of each TEG unit 40 faces the hot-side heat exchanging surface of a facing TEG unit 40.

The TEG module 20 further comprises a coolant pipe array 43. The coolant pipe array 43 comprises a plurality of U-flow coolant pipes 44 having an inlet end and an outlet end, wherein both the inlet end and the outlet end are disposed at the same end of each U-flow coolant pipe 44, with one positioned above the other in the vertical direction. The coolant fluid within each U-flow coolant pipe 44 therefore flows in one direction into the U-flow coolant pipe 44 from the inlet, and in the opposite direction towards the outlet and out of the U-flow coolant pipe 44. The plurality of U-flow coolant pipes 44 are interspersed within the TEG module 20, such that each U-flow coolant pipe 44 is disposed between and in substantially parallel alignment with each pair of cold-side heat exchanging surfaces of opposed TEG units 40, and adjacent to the outward facing cold-side heat exchanging surfaces of the TEG units 40 at each end of the TEG module 20. Each U-flow coolant pipe 44 is arranged such that the portion of the pipe in which the coolant fluid flows in from the inlet extends substantially parallel to, and in contact with, the cold-side heat exchanging surface of the associated TEG unit 40.

The TEG module 20 further comprises a pair of parallel metal plates that extend substantially parallel to, and in contact with, the hot-side heat exchanging surface of each TEG unit 40. These plates create a series of channels defining exhaust gas passages 46 through which the exhaust gas may flow through the TEG module 20.

A plurality of wedges 48 is inserted in the TEG module 20 to separate adjacent U-flow coolant pipes 44 of adjacent TEG units 40. A clamping band 50 extends around the perimeter of the TEG module 20, co-planar with the main axis 42 along which the components of the TEG module 20 are arranged. The TEG module 20 is further provided with a pair of bridge-like end buffers 52 positioned at either end of the main axis of the TEG module 20. After assembly, the wedges 48 remain in place in the TEG module 20 to ensure the coolant chambers remain firmly in place.

Accordingly, in the TEG module arrangement shown in FIG. 3, the main component parts are provided in the following order: U-flow coolant pipe 44, TEG unit 40, exhaust gas passage 46, TEG unit 40, U-flow coolant pipe 44, wedge 48, U-flow coolant pipe 44, TEG unit 40, exhaust gas passage 46, TEG unit 40, U-flow coolant pipe 44, wedge 48, and so on.

In use, hot exhaust gas is directed through the exhaust gas passages 46 of the TEG module 20, increasing the temperatures of the hot-side heat-exchange surfaces.

Meanwhile cooling fluid (e.g. water) is passed through the cooling pipe array 43 of the TEG module 20 to maintain the temperatures of the cold-side heat exchange surfaces. This produces the necessary temperature gradient across each TEG unit 40 to produce energy. The use of cooling fluid maximises the temperature gradient and in turn the electrical output of each TEG unit.

In some embodiments, convector fins 53 such as those found in standard convection radiators may extend from each hot-side heat exchanging surface into the exhaust gas passages 46. The presence of the convector fins 53 increases the surface area of heat conductive material in contact with the hot exhaust gas, thereby increasing the heat transfer to the hot-side heat exchange surfaces along the exhaust gas passages 46.

Various measures are taken to ensure that the cold-side heat exchange surfaces are held in close contact with the U-flow coolant pipes 44 for maximised heat transfer. For example, as noted above wedges 48 are inserted between the adjacent U-flow coolant pipes 44. The clamping band 50 also generates an inwardly-directed clamping force on the TEG module components, and the end buffers 52 spread the effects of this clamping force more evenly across the cross-section of the TEG module 20 to prevent any warping or deformation of the components due to uneven pressure.

It should be noted that all directional references herein, for example references to 'left, 'right', 'up', 'down', 'vertical', and 'horizontal', are made with respect to the embodiments shown in the appended figures. However it will be appreciated that the energy recovery unit and its constituent components may be arranged and mounted in use in different orientations to those shown in the appended figures, and that such arrangements should be deemed to fall within the scope of the present invention, as defined by the accompanying claims.

Figure 4:
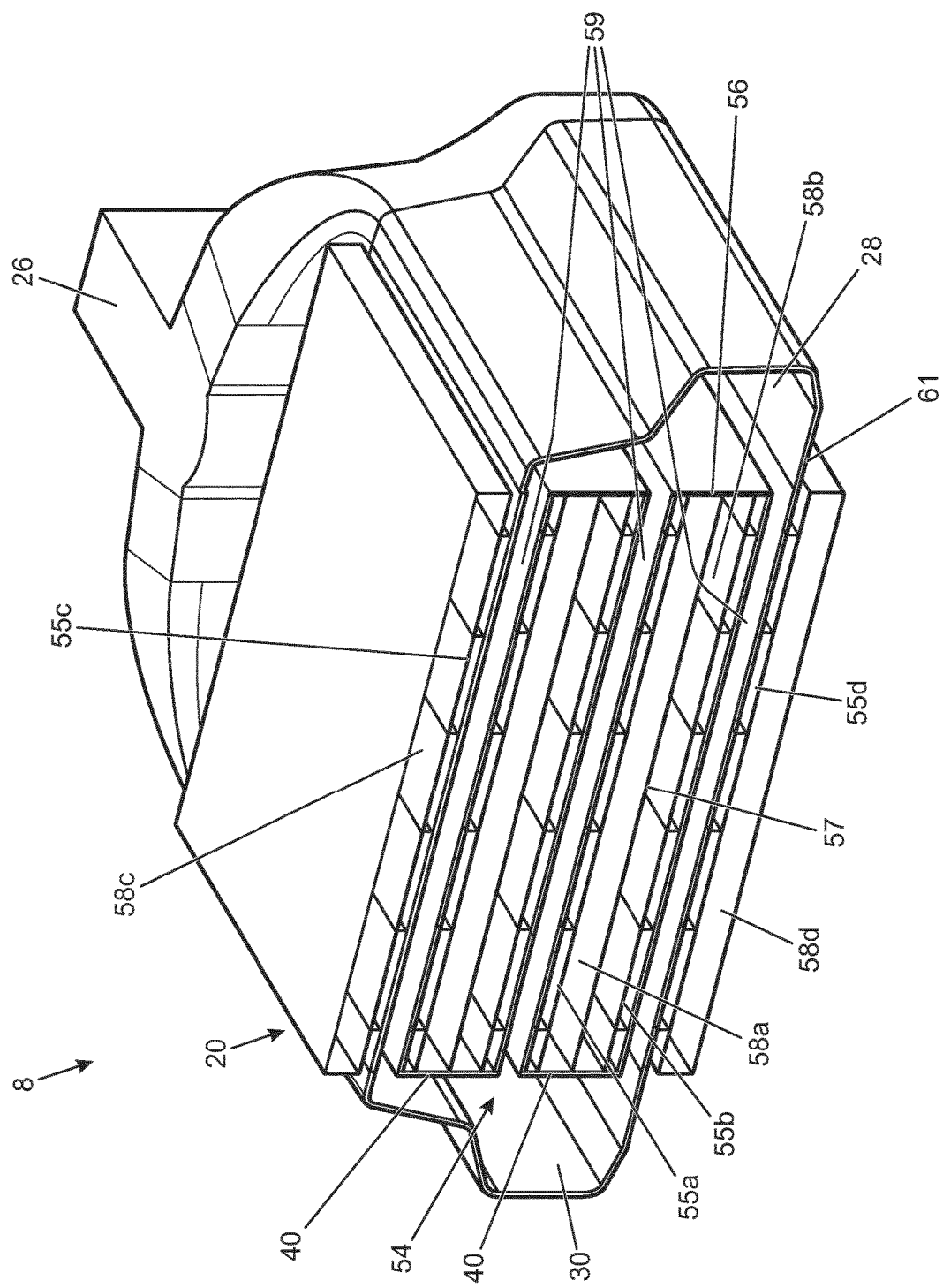
FIG. 4 is a perspective cross-sectional view of the energy recovery unit shown in FIG. 2.

FIG. 4 is a perspective cross-sectional view of the energy recovery system 8 in FIG. 2. The energy recovery system 8 comprises a core 54 including a plurality of TEG units 40, in this case two double sided TEG units, and two single sided TEG units. Each double sided TEG unit comprises first and second opposing arrays 55a, 55b of TEGs. Each array of TEGs 55a, 55b is arranged side by side and has its 'hot' side attached to an outer casing 56 of the respective TEG unit 40 such that its cold side faces the cold side face of the adjacent TEG unit 40. A separation plate pair 57, separated by a wedge (not shown), is attached to the casing 56 and arranged intermediate to, and separate from, adjacent TEG arrays 55a, 55b. In this way, first and second cold air cooling channels, or coolant ducts, 58a, 58b, are arranged adjacent to or are in part defined by each cold side surface of the TEG arrays 55a, 55b. The plates 57 isolate the respective cold air cooling channels 48a, 48b from one another.

Each TEG casing 56 is enclosed and separate from the adjacent casing 56 of the core 54 such that a transverse exhaust gas passage 59 is provided passing between the casings 56 and from one bypass duct 28 to the other 30, depending on the orientation of the valves flaps 60, 62. The exhaust gas passage 59 also passes on the other side of each casing 56 intermediate the casings 56 and an interior surface of the exterior structure 61 of the energy recovery system 8. A further array of TEGs 55c, 55d is provided on the exterior surface of the structure 61, the TEGs 55c, 55d having their hot side connected to the structure 61 so as to conduct thermal energy from the exhaust gas in the passage 59. Further cooling ducts 58c, 58d are connected to cold sides of the other TEG arrays 55c, 55d.

Figure 5A:
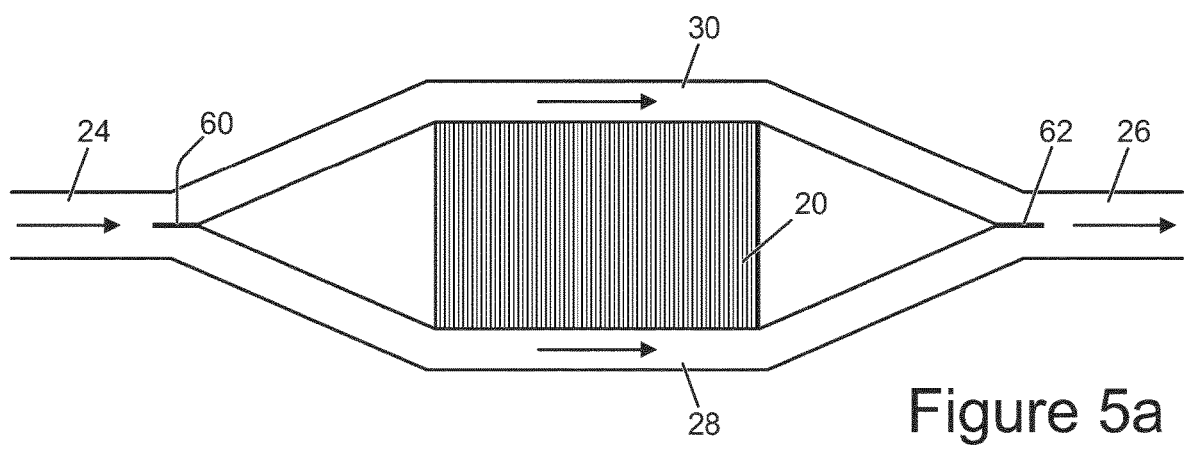
FIGS. 5a to 5c are schematic plan views of the energy recovery unit shown in FIG. 2, operating in different modes in accordance with various embodiments of the present invention.
Figure 5B:
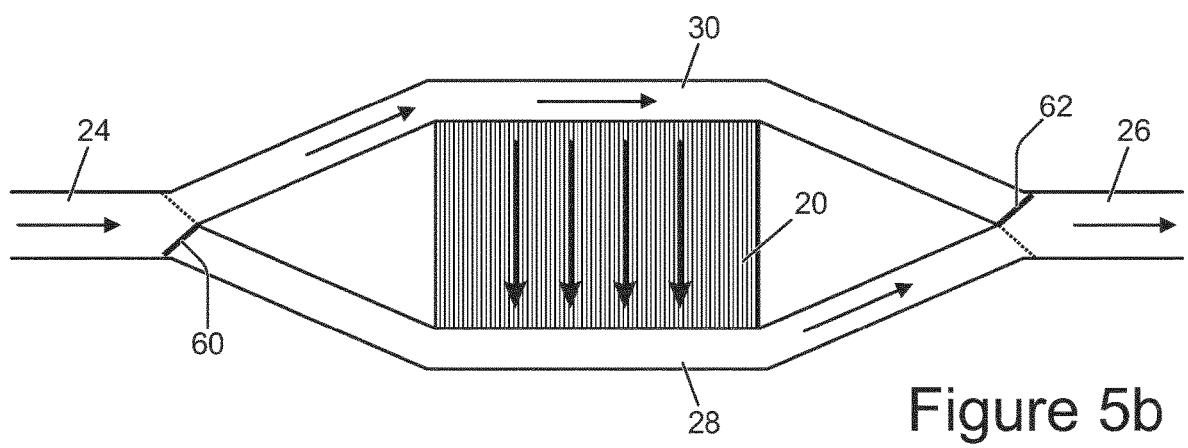
Figure 5C:
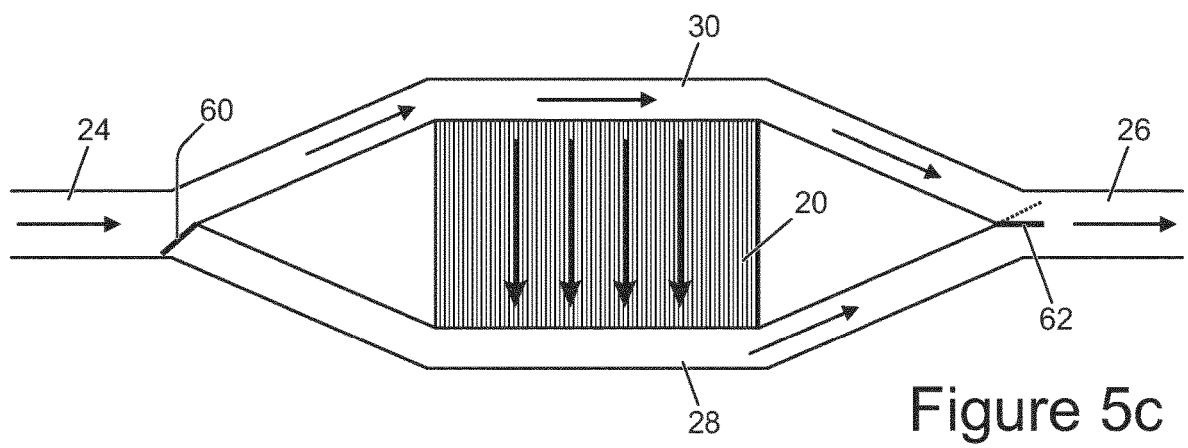

FIGS. 5a to 5c are schematic plan views of the energy recovery unit 8 of FIG. 2 as viewed from above, or the energy recovery unit 8 of FIG. 4 as viewed from the side. FIGS. 5a to 5c illustrate different operating modes of the energy recovery unit 8.

Each operating mode is associated with a different configuration of the inlet and outlet valves. Specifically, each operating mode is defined by the relative proportions of exhaust gas flowing through the TEG module 20 and the bypass ducts 28, 30, which are determined by the degree to which each valve flap 60, 62 is deflected relative to the main flow direction of the exhaust gas, and the directions in which the deflections occur. Three main modes of operation exist—a 'bypass' mode, illustrated in FIG. 5a; a 'full flow' mode, illustrated in FIG. 5b; and a 'feathering' mode, illustrated in FIG. 5c.

In the bypass mode, neither the inlet valve flap 60 nor the outlet valve flap 62 is substantially deflected, and so remain substantially parallel to the main flow direction of the exhaust gas. This allows the exhaust gas to flow unimpeded from the inlet pipe 24 past each side of the inlet valve, into the bypass ducts 28, 30, past the outlet valve and subsequently exit the energy recovery unit 8 through the outlet pipe 26 without entering the TEG module 20 at all.

It is noted that the exhaust gas will not change direction so as to enter an exhaust gas passage 46 of the TEG module 20 unless there is significant resistance to flow along the bypass ducts 28, 30. Therefore in the bypass mode, substantially all of the exhaust gas flows through the bypass ducts 28, 30.

The energy recovery unit 8 is operated in the bypass mode when the TEG module 20 is in danger of overheating. For example, this can occur when the exhaust gas entering the energy recovery unit is at too high a temperature, or when the exhaust gas has been flowing through the TEG module 20 for a prolonged period of time.

In the full flow mode, the inlet valve flap 60 and outlet valve flap 62 are maximally deflected in opposite directions, each extending completely across a mouth of a different one of the bypass ducts 28, 30. This prevents the gas flow from exiting the energy recovery unit 8 from the same bypass duct through which it entered, and so forces all of the exhaust gas through the TEG module 20, as no direct route through either bypass duct 28, 30 from the inlet pipe 24 to the outlet pipe 26 is available for the gas to flow.

For example, as may be seen from the plan view of FIG. 5b, the inlet valve flap 60 is deflected maximally downwards, causing the exhaust gas to flow entirely into the upper bypass duct 30; however, as the outlet valve flap 62 is deflected maximally upwards, the exhaust gas cannot exit the energy recovery unit 8 through the outlet pipe 26 directly from the upper bypass duct 30. Instead, the exhaust gas from the upper bypass duct 30 is forced through the exhaust gas passages 46 of the TEG module 20 and into the lower bypass duct 28, in order to reach the outlet pipe 26. The direction of cross-flow through the gas passages 46 of the TEG module 20 may be reversed by reversing the direction of deflection of the input and output valve flaps 60, 62 (as indicated by the dotted lines in FIG. 5b).

As a result of efficient heat exchange between the exhaust air and the metal plates of the TEG units 40, and the electrical energy generated from that heat, the exhaust gas cools significantly as it passes through each exhaust gas passage 46. Therefore the leading edges of each TEG unit 40 heat up much more quickly than the rest of the unit.

In an embodiment of the present invention, the direction of deflection of the valve flaps, and hence the direction of cross-flow through the exhaust gas passages 46 of the TEG module 20, is periodically alternated. This prevents overheating of the leading edges of the TEG module 20, thereby prolonging its lifespan.

The performance of the energy recovery unit 8 is also improved as the alternating flow creates a more even temperature profile across each hot-side heat exchanging surface than is achieved with a single direction flow. This means that the bypass mode is used less frequently, and more of the exhaust gas is utilised by the TEG module 20 to generate electricity.

In the feathering mode, shown in FIG. 5c, the inlet and outlet valve flaps 60, 62 are deflected to different degrees, with neither bypass duct 28, 30 fully closed. This allows some gas flow through the bypass ducts 28, 30, but creates sufficient resistance to flow to force some of the exhaust gas into the TEG module 20. The feathering mode may therefore be thought of as a combination of the bypass and full flow modes.

For example, as may be seen in FIG. 5c, the inlet valve flap 60 is deflected maximally downwards, while the output valve flap 62 remains substantially parallel to the main flow direction. The exhaust gas therefore flows along one of two paths: the first path corresponds to direct flow from the inlet pipe 24 to the outlet pipe 26 through the upper bypass duct 30; the second path corresponds to flow from the upper bypass duct 30, through the gas passages 46 of the TEG module 20 to the lower bypass duct 28, and into the outlet pipe 26.

The degree and direction of deflection of the output valve flap 62 may be varied (as indicated by the dotted line in FIG. 5c) depending on the proportion of gas that is intended to flow through the gas passages 46 of the TEG module 20. A greater upwards deflection of the outlet valve flap 62 in FIG. 5c results in a higher proportion of gas passing through the TEG module 20.

This mode is useful to ensure that at high gas temperatures the amount of exhaust gas passing through the TEG module 20 (and hence the amount of heat input to each TEG unit 40) is supported by the water cooling capabilities of the coolant pipe array 43.

Although specific valve deflections are shown in FIGS. 5a to 5c, it should be noted that the functionality of the energy recovery unit 8 would not be substantially affected if the deflections of the inlet valve flap 60 and the outlet valve flap 62 were to be reversed from that which is illustrated. For example, in the feathering mode, it is sufficient for either one of the valve flaps 60, 62 to be maximally deflected in a particular direction, so long as the angle of deflection of the other valve flap remains variable, in order to control the amount of exhaust gas flowing through the TEG module 20.

It should be noted that the presence of independently operable valves would be a useful element of those embodiments where the energy recovery unit operates in the feathering mode, as this would enable precision control of each valve flap. By comparison, the presence of a 'master' lever would be a useful addition in those embodiments where the energy recovery unit operates in the bypass or full flow modes, as the degree of deflection of the two valve flaps should ideally mirror each other. The use of the master lever to automate the valve deflections would be particularly useful when periodically alternating flow is required.

Figure 6:
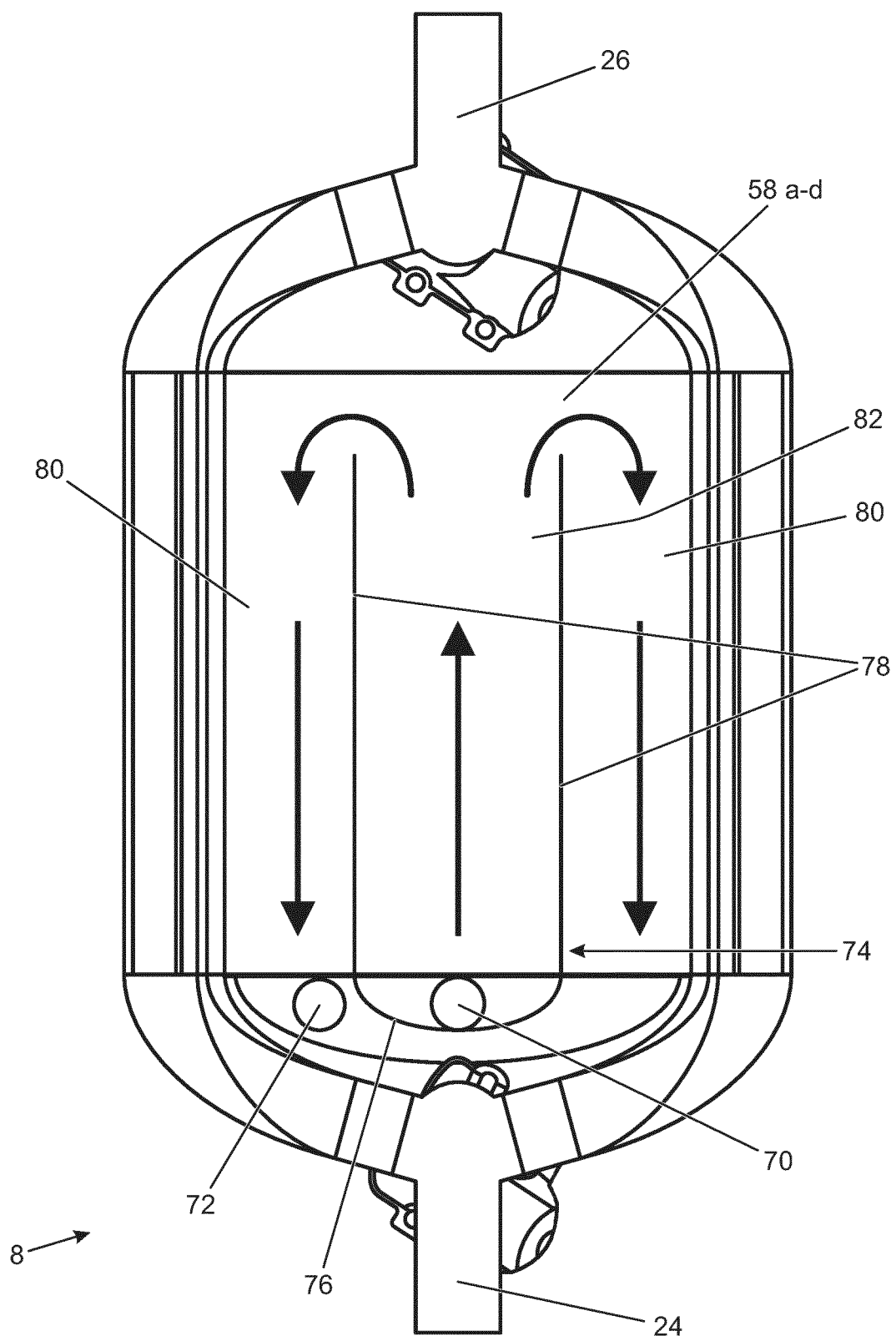
FIG. 6 is a top cross-section view of the energy recovery unit shown in FIG. 2, according to a further embodiment of the present invention.

With reference to FIG. 6, the coolant ducts 58a to 58d are shown schematically in a cross-sectional view from above the energy recovery unit 8. The coolant ducts 58a to 58d include an inlet 70 and an outlet 72. Both the inlet 70 and the outlet 72 are provided at the same end of the coolant duct 58. In this embodiment the inlet 70 and outlet 72 are provided at the inlet 24 end of the unit 8. The inlet 70 is a single port like the outlet 72. The outlet 72 is arranged at one side of the recovery unit 8 towards one end of a TEG array (not shown but visible from FIG. 4).

The coolant ducts 58a to 58d have a rectangular profile with rounded ends and a U-shaped flow guide 74 free standing within it. The flow guide 74 has a rounded end 76 toward the inlet 24 of the recovery unit 8 and legs 78 extending towards the outlet 26. In this way, the flow guide 74 separates the duct into two 'warm' outside channels 80 and a 'cold' central channel 82. As a result coolant liquid is able to flow in two directions towards the outlet 72. Firstly, the coolant liquid flows along the 'cold' central channel 82. Secondly, the coolant stream splits near the outlet 26 end of the recovery unit 8 and reverses its direction to flow towards the coolant outlet 72 by flowing along the outside channels 80. Accordingly, the outside coolant channels 80 are supplied with coolant of substantially the same temperature.

Figure 7A:
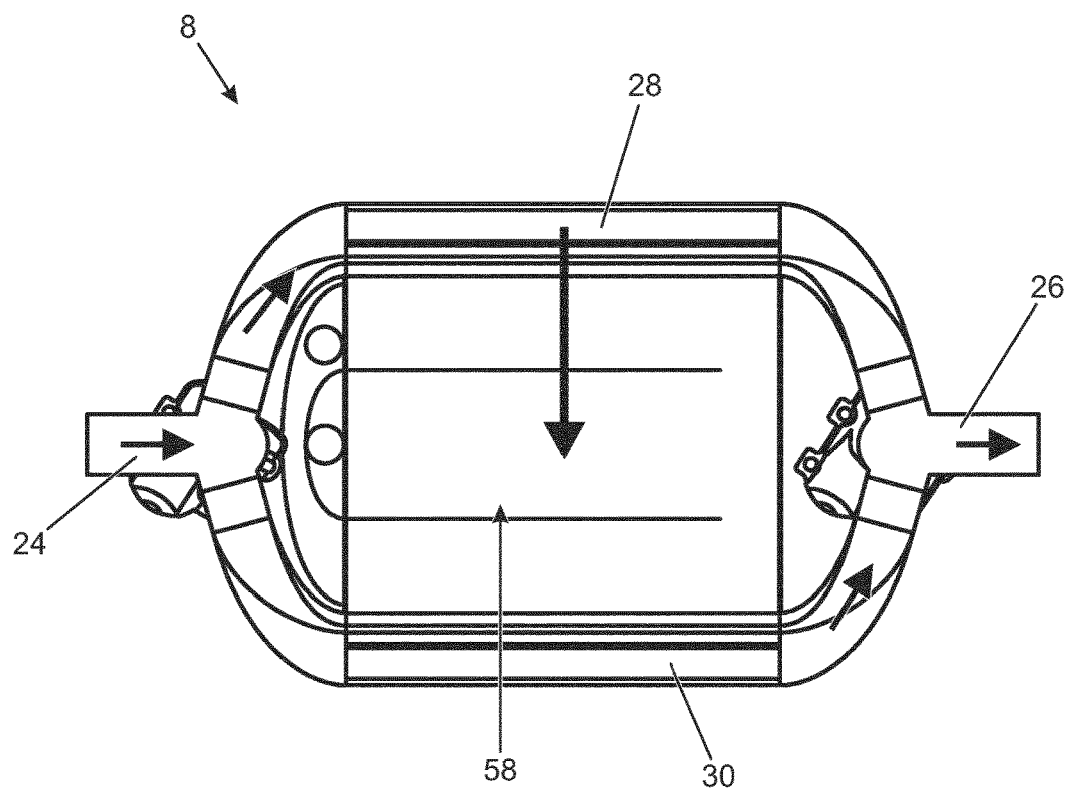
FIG. 7a is a similar view to FIG. 6 showing exhaust gas flowing in a first direction through the TEG module.
Figure 7B:
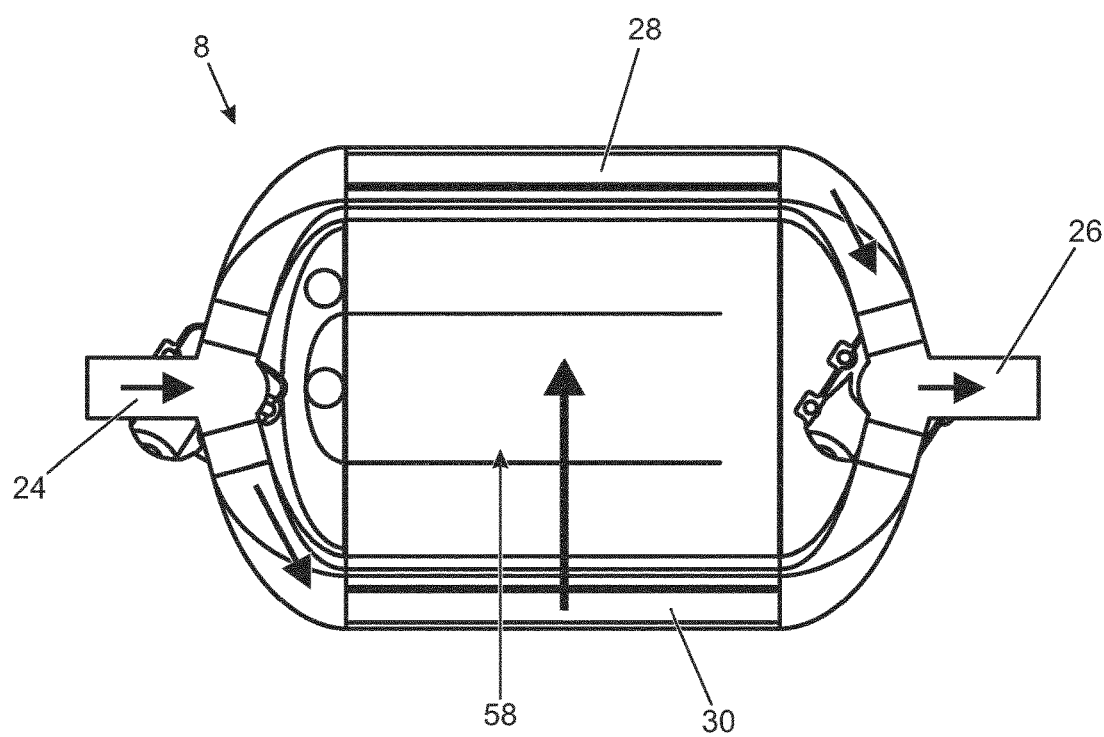
FIG. 7b is a similar view to FIG. 6 showing exhaust gas flowing in a second direction through the TEG module.

The impact of causing the coolant to flow in this way is best explained with reference to the exhaust flows as shown in FIGS. 7a and 7b, which correspond to the modes of operation explained above in relation to FIG. 5b. References made to 'uppermost', 'lowermost', 'upstream', 'downstream', 'upwards', and 'downwards' with respect to FIGS. 7a and b refer to the orientation shown in the figure.

The exhaust flow in FIG. 7a shows the configuration corresponding to FIG. 5b where the inlet flap is maximally downwards and the outlet flap is maximally upwards. The exhaust gas is thus directed downwards through the TEG arrays (not shown). It can be seen by comparing FIGS. 7a and 6 that the exhaust gas is substantially transverse to the coolant when flowing along the channels 80, 82. The exhaust gas is cooled by the coolant such that the upstream gas is hotter than the downstream gas. Thermal energy induced into the coolant renders the uppermost channel 80 of coolant liquid, directed toward the outlet 72, hotter than the central and lowermost channels 82, 80.

In contrast, the exhaust flow in FIG. 7b shows the configuration corresponding to FIG. 5b where the inlet flap is maximally upwards (as in the dotted line position) and the outlet flap is maximally downwards. Accordingly, the exhaust gas flows upwards over the TEG arrays. In this way, the coolant liquid in the lowermost channel 80 experiences the highest degree of thermal energy exchange due to the upstream exhaust gas being hotter than that downstream. In this way, the lowermost column 80 contains the warmest coolant compared to the central and uppermost coolant channels 82, 80.

In this way, regardless as to the direction of exhaust gas flow, the exhaust gas should be cooled to substantially the same extent. In such an arrangement, when TEGs at the end of each array experience temperature extremes, and there is a risk of reduced performance or even damage, the inlet and outlet valve flaps 60, 62, can be reconfigured to reverse the temperature profile of the TEGs at opposing ends of the arrays. The energy recovery unit 8 will thus become more efficient and have a prolonged working life as a result.

A further benefit of arranging the inlet 70 and outlet 72 at the same end of the unit 8 is that it leaves space at the other end to accommodate other features of the unit, such as electrical connections to the unit, for example.

Figure 8:
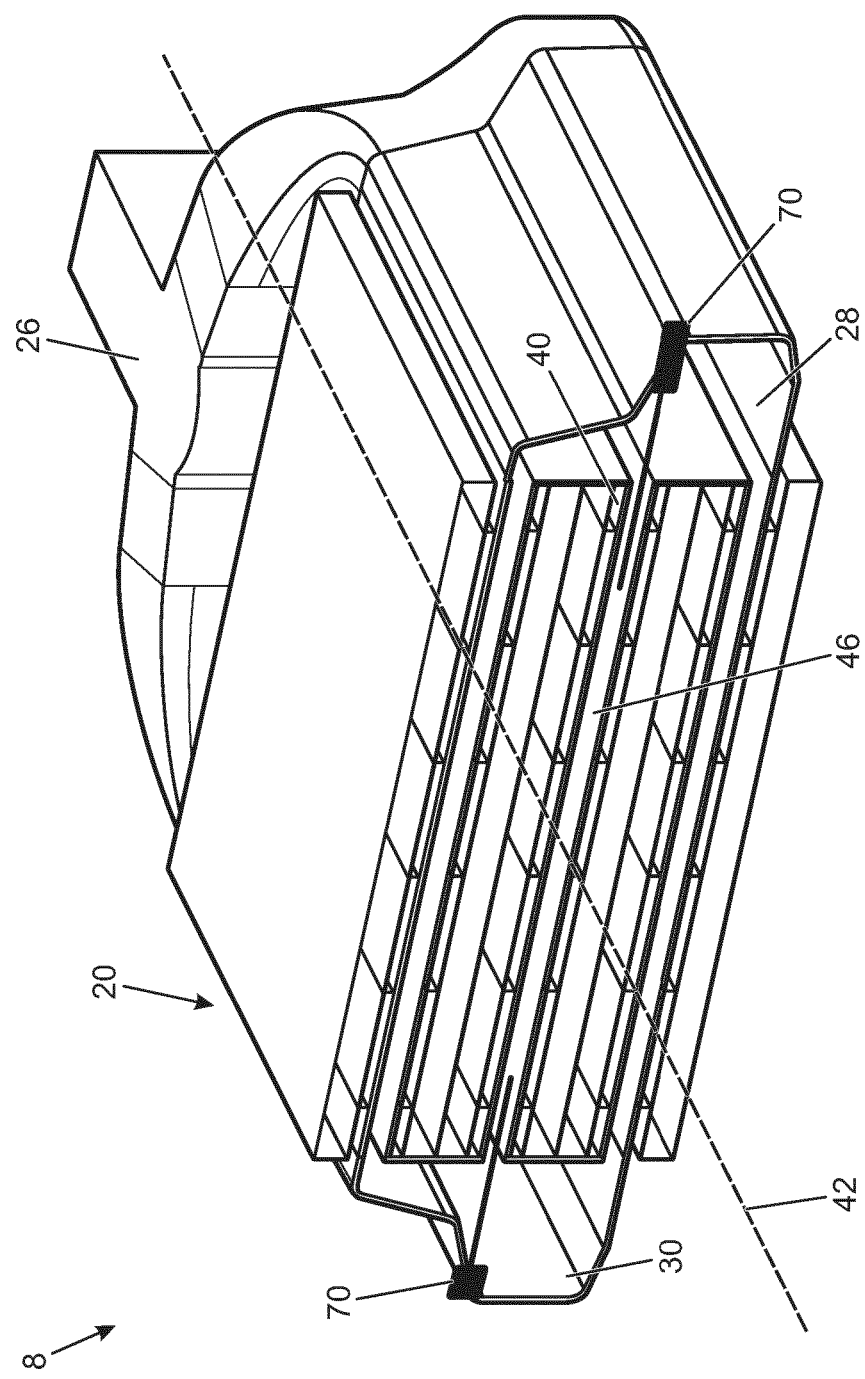
FIG. 8 is a perspective cross-sectional view of an energy recovery unit in accordance with another embodiment of the present invention.

FIG. 8 shows a perspective cross-sectional view of an energy recovery unit 8 incorporating a TEG module 20 according to an alternative embodiment of the present invention. In this embodiment, as in the embodiment of FIGS. 2 and 4, bypass ducts 28, 30 flank each side of the TEG module 20. However, the TEG module 20 differs from that of previous embodiments in that the TEG units 40 and exhaust gas passages 46 defined between those units 40 are oriented to lie parallel to a plane containing the main axis 42.

Moreover, each TEG unit 40 extends substantially along the entire length of the bypass ducts 28, 30 such that exhaust flow can enter each exhaust gas passage 46 of the TEG module 20 at any longitudinal point in the bypass ducts 28, 30.

Exhaust gas flows generally horizontally through the exhaust gas passages 46. It is noted that, in the absence of features to direct the exhaust flow orthogonally relative to the main flow direction, typically the exhaust gas takes a diagonal path through each exhaust gas passage 46, as exhaust gas that enters an exhaust gas passage 46 at an end of the energy recovery unit 8 near to the inlet pipe 24 will tend to exit the passage at a longitudinal point that is closer to the outlet pipe 26.

The embodiment shown in FIG. 8 incorporates thermocouple devices 70 to measure temperature at spaced locations within the TEG module 20. In this embodiment, a respective thermocouple device 70 is inserted into each end of one of the exhaust gas passages 46 (and positioned at or near where the gas passages 46 feed into the bypass ducts 28, 30), in order to measure the temperature at either end, and thereby determine the temperature difference across the TEG module 20 (i.e. perpendicular to its main axis 42).

The temperature measured using the thermocouple devices 70 may be used to determine the best mode of operation of the energy recovery unit 8. For example, if the temperature of a portion of the thermoelectric generator is measured to be above a certain safe threshold of operation, the valve actuators may automatically change the valve flap deflections so that the energy recovery unit 8 operates in the bypass mode. In another example, when the temperature difference between the two ends of the exhaust gas passage 46 is deemed to be greater than a certain pre-defined threshold, the valve actuators will automatically change the direction of deflection of the valve flaps 60, 62. This reverses the direction of cross-flow through the TEG module 20 and re-balances the temperatures within the TEG module 20. This could continue until the thermocouple device 70 indicates that the temperature of the TEG units 40 has reached a safe value, and the valve actuators may then return the energy recovery unit 8 to the full flow or feathering modes.

It is noted that thermocouples 70 may be used in any embodiment of the invention in a similar way to that shown in FIG. 8.

Figure 9:
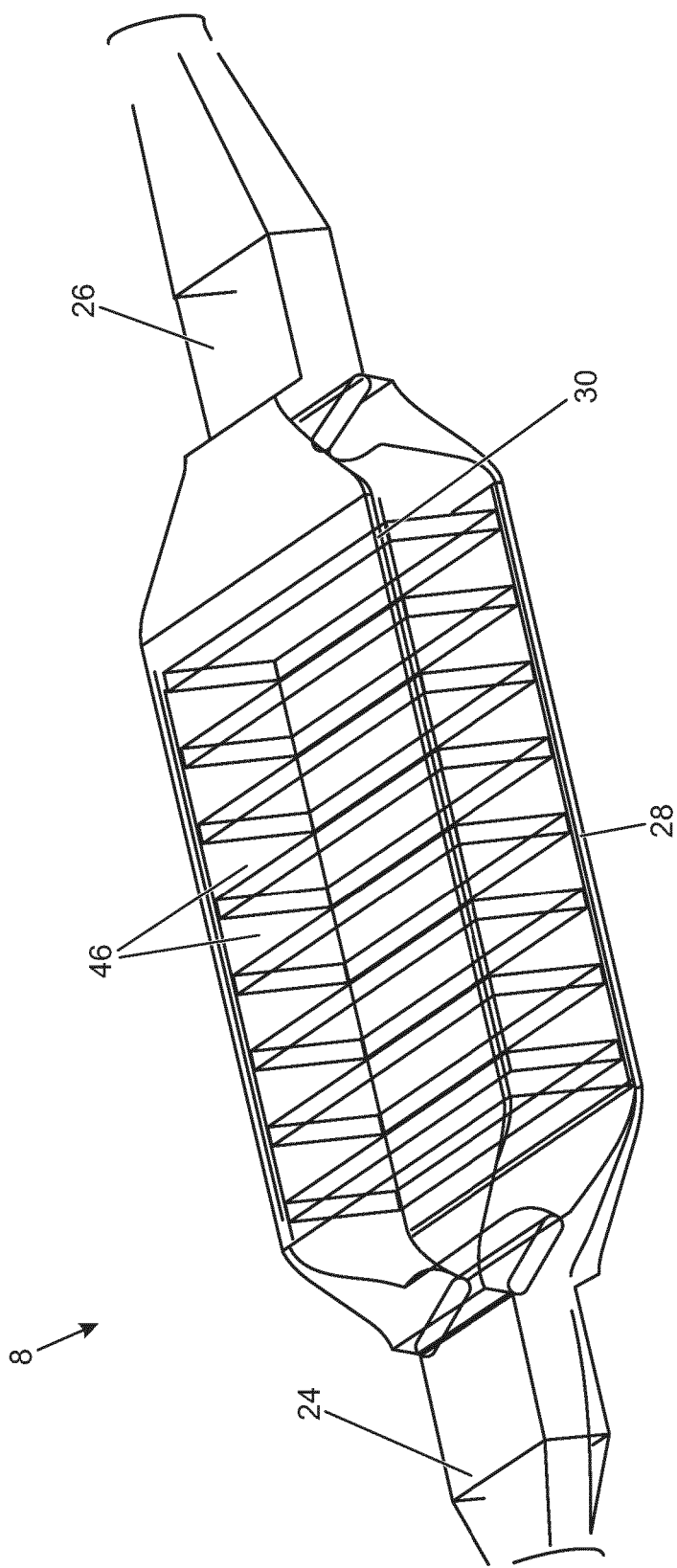
FIG. 9 is a perspective, transparent view of the energy recovery unit shown in FIG. 2 showing an internal TEG module according to another embodiment.

FIG. 9 shows an energy recovery unit 8 according to another embodiment of the invention which also incorporates the TEG module 20 of FIG. 3. The housing of the energy recovery unit 8 is shown as transparent in FIG. 9 so as to make the internal TEG module 20 visible; although it will be appreciated that in practice typically the TEG module 20 is not visible externally.

Similarly to the previous embodiment shown in FIG. 2, in the embodiment shown in FIG. 9 the TEG module 20 is arranged such that the exhaust gas passages 46 are perpendicular to the direction of the main gas flow through the energy recovery unit 8. In other words, the flow of exhaust gas through the TEG module 20 is in a plane substantially perpendicular to the direction in which the main gas flow through the energy recovery unit 8 occurs.

However, in contrast with the previous embodiment (shown in FIG. 2) in which the bypass ducts 28, 30 of the energy recovery unit 8 are disposed on the sides of the energy recovery unit 8 for horizontal cross flow, in the configuration of FIG. 9, the bypass ducts 28, 30 are positioned above and below the TEG module 20, such that any gas flow through the exhaust gas passages 46 of the TEG module 20 is substantially vertical.

Figure 10:
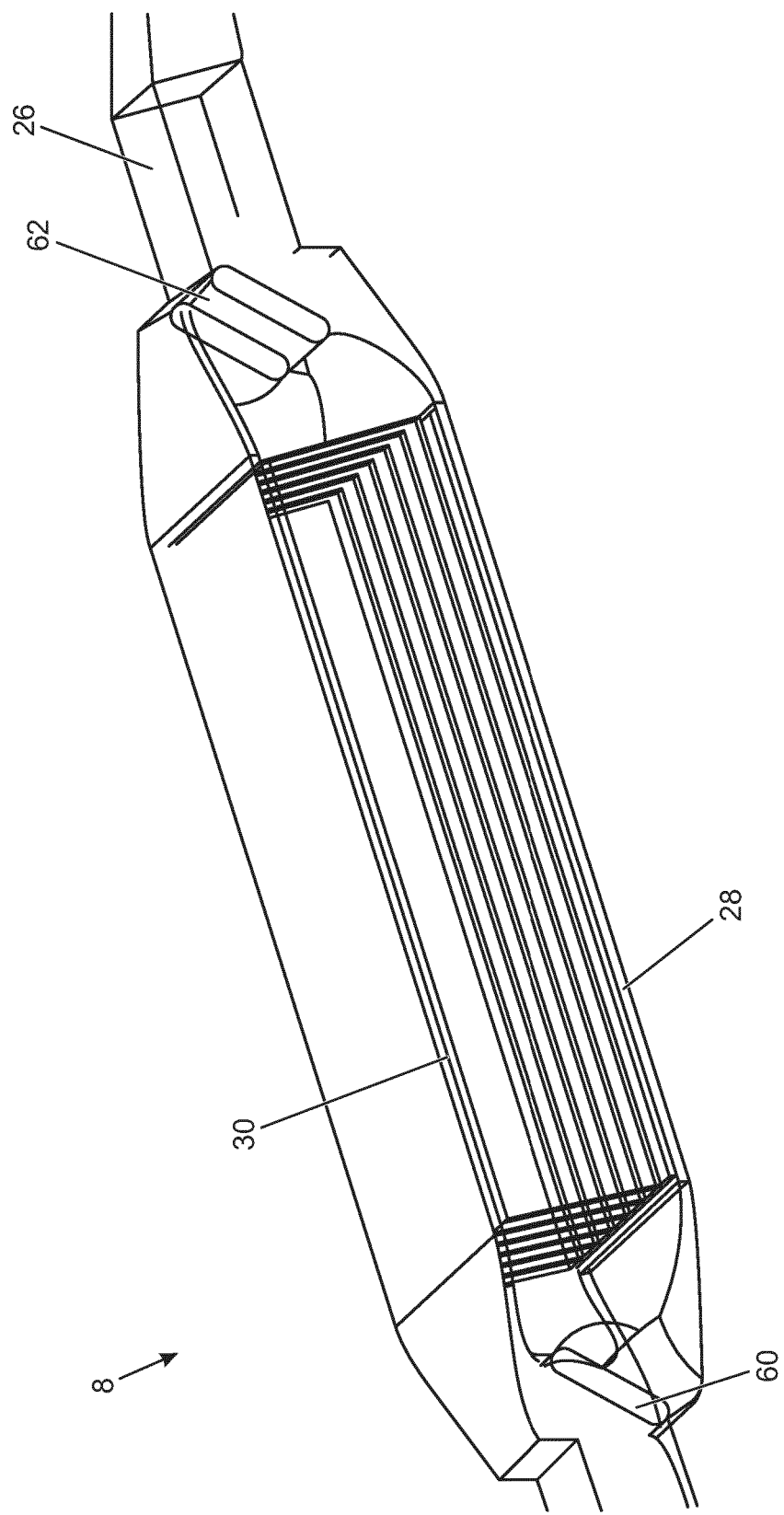
FIG. 10 is a perspective view of an energy recovery unit, implemented in a vehicle exhaust system, in accordance with yet another embodiment of the present invention.

FIG. 10 shows an energy recovery unit 8 of a further embodiment of the present invention comprising another alternative configuration of the TEG module 20. Similarly to the embodiment shown in FIG. 8, the heat-exchanging surfaces of the TEG units 40 lie in a plane that is parallel to the direction of the main gas flow in the energy recovery unit 8. However, in contrast with the embodiment of FIG. 8, in the FIG. 10 embodiment the energy recovery unit 8 is arranged such that the bypass ducts 28, 30 are positioned above and below the TEG module 20. Therefore, any gas flow through the exhaust gas passages 46 of the TEG module 20 is substantially vertical. Similarly to the FIG. 8 arrangement, in the embodiment shown in FIG. 10 exhaust gas typically takes a diagonal path through each exhaust gas passage.

In other embodiments of the present invention (not shown), either the inlet pipe 24 or the outlet pipe 26 is arranged so as to be angled at an acute angle (for example, 45°) to the direction of the main gas flow within the energy recovery unit 8. This is in contrast with the previous embodiments where both the inlet pipe 24 and outlet pipe 26 are substantially parallel to one another and to the direction of the main gas flow within the energy recovery unit 8. In some embodiments, both the inlet pipe 24 and the outlet pipe 26 are angled at acute angles to the direction of the main gas flow within the energy recovery unit 8. The pipes may be angled to the same degree (such that they are effectively parallel to one another), or they may be angled to different degrees. This arrangement of inlet and outlet pipes is useful as it increases the flexibility of positioning of the energy recovery unit, allowing it to be mounted in the vicinity of a bend in the exhaust system, and thereby uses the available space efficiently.

Many modifications may be made to the above examples without departing from the scope of the present invention as defined in the accompanying claims.

The invention claimed is:

1. An energy recovery unit for use in a vehicle exhaust system, the energy recovery unit comprising:
   an inlet for receiving exhaust gas from the exhaust system;
   an outlet for returning exhaust gas to the exhaust system;
   a thermoelectric generator disposed between the inlet and the outlet; and
   a valve arrangement operable to direct exhaust gas entering the inlet across the thermoelectric generator to enable the thermoelectric generator to generate electrical energy from thermal energy contained in the exhaust gas, wherein the valve arrangement is operable to vary the direction of exhaust gas flow between two opposing directions across the thermoelectric generator from the inlet to the outlet.

2. The energy recovery unit of claim 1, further comprising a gas pipe network configured to connect the inlet and the outlet, wherein the gas pipe network comprises a first bypass duct and a second bypass duct, the first and second bypass ducts extending between the inlet and the outlet and being disposed along respective opposing ends of the thermoelectric generator, and wherein exhaust gas flows through the bypass ducts from the inlet to the outlet in a first flow direction.

3. The energy recovery unit of claim 2, wherein the valve arrangement is operable to direct exhaust gas across the thermoelectric generator from the first bypass duct to the second bypass duct in a second flow direction, or from the second bypass duct to the first bypass duct in a third flow direction that is opposed to the second flow direction.

4. The energy recovery unit of claim 3, wherein the thermoelectric generator is arranged to have the second and third flow directions be perpendicular to the first flow direction.

5. The energy recovery unit of claim 2, wherein the valve arrangement comprises a first valve that is disposed at the inlet, the first valve comprising a first valve member that is positionable by a first valve actuator to control exhaust gas flow into the first and second bypass ducts.

6. The energy recovery unit of claim 5, wherein the valve arrangement comprises a second valve that is disposed at the outlet, the second valve comprising a second valve member that is positionable by a second valve actuator to control discharge of exhaust gas from the first and second bypass ducts.

7. The energy recovery unit of claim 6, wherein the first valve member is positionable to direct exhaust gas flow into both the first bypass duct and the second bypass duct, and the second valve member is positionable to allow exhaust gas to exit both the first bypass duct and the second bypass duct, thereby allowing the exhaust gas to flow in the first flow direction.

8. The energy recovery unit of claim 6, wherein the first valve member is positionable to occlude an entrance to the first bypass duct, and the second valve member is positionable to occlude an exit from the second bypass duct, so that the exhaust gas flows from the second bypass duct to the first bypass duct across the thermoelectric generator.

9. The energy recovery unit of claim 6, wherein the first valve member is positionable to occlude an entrance to the second bypass duct, and the second valve member is positionable to occlude an exit from the first bypass duct, so that the exhaust gas flows from the first bypass duct to the second bypass duct across the thermoelectric generator.

10. The energy recovery unit of claim 6, wherein the first valve member is positionable to partially occlude an entrance to either the first bypass duct or the second bypass duct.

11. The energy recovery unit of claim 6, wherein the second valve member is positionable to partially occlude an exit from either the first bypass duct or the second bypass duct.

12. The energy recovery unit of claim 1, further comprising a plurality of thermoelectric generators, wherein the valve arrangement is operable to direct exhaust gas flow across each thermoelectric generator and to vary the direction of exhaust gas flow across each thermoelectric generator.

13. The energy recovery unit of claim 1, wherein the exhaust gas inlet and exhaust gas outlet are arranged at opposing ends of the energy recovery unit and arrays of thermoelectric generators (TEGs) are transversely arranged therebetween, and further wherein the valve arrangement is arranged to direct the exhaust gas in a first direction across the TEGs from a first side to a second side of the energy recovery unit and further arranged to direct the exhaust gas in a second, opposite, direction across the TEGs from the second side of the energy recovery unit to the first side of the unit, the energy recovery unit further comprising
   at least one coolant duct in thermal contact with a cold surface of a respective one of the arrays of TEGs; the or each coolant duct comprising an inlet for influx of coolant and an outlet for outflow of coolant, the inlet being positioned centrally intermediate the first and second sides of the unit; and
   a flow guide arranged to direct the coolant centrally away from the coolant inlet and along the first and second sides of the energy recovery unit toward the coolant outlet.

14. The energy recovery unit of claim 13, wherein the coolant inlet is positioned at an exhaust gas inlet end of the energy recovery unit.

15. The energy recovery unit of claim 13, wherein the coolant inlet and the coolant outlet are positioned at the same end of the energy recovery unit.

16. The energy recovery unit of claim 15, wherein the flow guide comprises a U-shaped wall comprising a bend at one end, the coolant inlet being positioned within the U-shaped wall and the coolant outlet being positioned outside the U-shaped wall to divide the coolant duct into a central channel directing coolant centrally away from the coolant inlet and opposing side channels directing coolant towards the coolant outlet.

17. A vehicle exhaust system comprising the energy recovery unit of claim 13.

18. A vehicle comprising the energy recovery unit of claim 13.

19. A vehicle exhaust system comprising the energy recovery unit of claim 1.

20. A vehicle comprising the energy recovery unit of claim 1.

* * * * *